(12) United States Patent
Metzler et al.

(10) Patent No.: US 7,462,553 B2
(45) Date of Patent: Dec. 9, 2008

(54) ULTRA THIN BACK-ILLUMINATED PHOTODIODE ARRAY FABRICATION METHODS

(75) Inventors: Richard A. Metzler, Medina, OH (US); Alexander O. Goushcha, Aliso Viejo, CA (US)

(73) Assignee: Semicoa, Costa Mesa, CA (US)

( * ) Notice: Subject to any disclaimer, the term of this patent is extended or adjusted under 35 U.S.C. 154(b) by 529 days.

(21) Appl. No.: 11/136,281

(22) Filed: May 24, 2005

(65) Prior Publication Data

US 2005/0221541 A1 Oct. 6, 2005

Related U.S. Application Data

(60) Continuation-in-part of application No. 10/863,558, filed on Jun. 8, 2004, now Pat. No. 7,112,465, which is a division of application No. 10/606,053, filed on Jun. 25, 2003, now Pat. No. 6,762,473.

(51) Int. Cl.
 *H01L 21/30* (2006.01)

(52) U.S. Cl. ............... 438/459; 438/22; 438/48; 438/963

(58) Field of Classification Search ............ 257/447, 257/460, 443; 438/144–148, 60, 73, 48, 438/963
See application file for complete search history.

(56) References Cited

U.S. PATENT DOCUMENTS

| | | | |
|---|---|---|---|
| 4,144,096 A | 3/1979 | Wada et al. | |
| 4,963,971 A * | 10/1990 | Rosetti et al. | ............... 257/127 |
| 5,072,312 A * | 12/1991 | Schwarzbauer et al. | ..... 257/168 |
| 5,075,748 A | 12/1991 | Hisa | |
| 5,538,564 A | 7/1996 | Kaschmitter | |
| 5,670,383 A | 9/1997 | Piccone et al. | |
| 6,111,305 A | 8/2000 | Yoshida et al. | |
| 6,184,100 B1 | 2/2001 | Arai | |
| 6,426,991 B1 | 7/2002 | Mattson et al. | |
| 6,504,178 B2 | 1/2003 | Carlson et al. | |
| 6,653,164 B2 | 11/2003 | Miida | |
| 6,707,046 B2 | 3/2004 | Possin et al. | |
| 6,777,729 B1 | 8/2004 | Prince et al. | |
| 6,933,489 B2 | 8/2005 | Fujii et al. | |
| 2002/0000562 A1 * | 1/2002 | Carlson et al. | ................ 257/88 |

(Continued)

OTHER PUBLICATIONS

Derenzo, Stephen E., "Initial Characterization of a BGO-Photodiode Detector for High Resolution Positron Emission Tomography", Feb. 1984, IEEE Transactions on Nuclear Science, vol. NS-31, No. 1, pp. 620-626.

(Continued)

*Primary Examiner*—Wai-Sing Louie
*Assistant Examiner*—John C Ingham
(74) *Attorney, Agent, or Firm*—Blakely Sokoloff Taylor & Zafman LLP (57) ABSTRACT

Ultra thin back-illuminated photodiode array fabrication methods providing backside contact by diffused regions extending through the array substrate. In accordance with the methods, a matrix is diffused into one surface of a substrate, and at a later stage of the substrate processing, the substrate is reduced in thickness and a similar matrix is diffused into the substrate from the other side, this second diffusion being aligned with the first and contacting the first within the substrate. These two contacting matrices provide good electrical contact to a conductive diffusion on the backside for a low resistance contact to the backside. Various embodiments are disclosed.

21 Claims, 9 Drawing Sheets

U.S. PATENT DOCUMENTS

| | | | |
|---|---|---|---|
| 2002/0020846 A1 | 2/2002 | Pi et al. | |
| 2002/0058353 A1 | 5/2002 | Merrill | |
| 2002/0148967 A1* | 10/2002 | Iwanczky et al. | 250/370.11 |
| 2003/0209652 A1 | 11/2003 | Fujii et al. | |
| 2004/0032026 A1* | 2/2004 | Yang et al. | 257/734 |
| 2004/0104351 A1 | 6/2004 | Shibayama | |
| 2004/0129992 A1 | 7/2004 | Shibayama | |

OTHER PUBLICATIONS

Takahashi, Tetsuhiko et al., "Design of Integrated Radiation Detectors with a-Si Photodiodes on Ceramic Scintillators for use in X-Ray Computed Tomography", Jun. 1990, IEEE Transactions on Nuclear Science, vol. 37, No. 3, pp. 1478-1482.

Burns, H. N. "Buck" et al., "Compact, 625-channel scannerless imaging laser radar receiver", 1996, Proc. SPIE, vol. 2748, pp. 39-46.

Iwanczyk, J.S. et al., "Simulation and modelling of a new silicon X-ray drift detector design for synchrotron radiation applications", 1996, Nuclear Instruments and Methods in Physics Research, Section A, vol. 380, pp. 288-294.

Kwa, Tommy A. et al., "Backside-Illuminated Silicon Photodiode Array for an Integrated Spectrometer", May 1997, IEEE Transactions on Electron Devices, vol. 44, No. 5, pp. 761-765.

Holland, S.E. et al., "Development of Low Noise, Back-Side Illuminated Silicon Photodiode Arrays", Jun. 1997, IEEE Transactions on Nuclear Science, vol. 44, No. 3, pp. 443-447.

Patt, B.E. et al., "High Resolution CsI(T1)/Si-PIN Detector Development for Breast Imaging", Aug. 1998, IEEE Transactions on Nuclear Science, vol. 45, No. 4, pp. 2126-2131.

Vishay Semiconductors S268P Data Sheet, "Silicon PIN Photodiode Array", May 20, 1999, Document No. 81538, pp. 1-5.

Detection Technology, Inc., "New Photodiode Array Products for Computer Tomography-Detectors", News Bulletin for the Customers and Cooperation Partners, Winter 2000-2001.

Patt, B.E. et al., "Fast-Timing Silicon Photodetectors", Jun. 2000, IEEE Transactions on Nuclear Science, vol. 47, No. 3, pp. 957-964.

Yang, Min et al., "High Speed Silicon Lateral Trench Detector on SOI Substrate", International Electron Devices Meeting, Dec. 2-5, 2001, New York, NY, IEDM Technical Digest, pp. 24.1.1-24.1.4, IEEE, US.

Hamamatsu Photonics K.K., Solid State Division, "Si Photodiode Catalog", Feb. 2002, pp. 1-25.

Tornai, Martin P. et al., "A novel silicon array designed for intraoperative charged particle imaging", Nov. 2002, Medical Physics, vol. 29, No. 11, pp. 2529-2540.

Luhta, Randy et al., "Back Illuminated Photodiodes for Multislice CT", Feb. 15-20, 2003, San Diego, California USA.

* cited by examiner

ULTRA THIN BACK-ILLUMINATED PHOTODIODE ARRAY FABRICATION METHODS

CROSS-REFERENCE TO RELATED APPLICATIONS

This application is a continuation-in-part of U.S. patent application Ser. No. 10/863,558 filed Jun. 8, 2004 now U.S. Pat. No. 7,112,465, which is a divisional of U.S. patent application Ser. No. 10/606,053, filed Jun. 25, 2003, now U.S. Pat. No. 6,762,473.

BACKGROUND OF THE INVENTION

1. Field of the Invention

The present invention relates to semiconductor photodiodes, and in particular, to the structures of high performance, back-illuminated photodiode arrays and the methods of fabricating such structures.

2. Prior Art

Figure 1A:
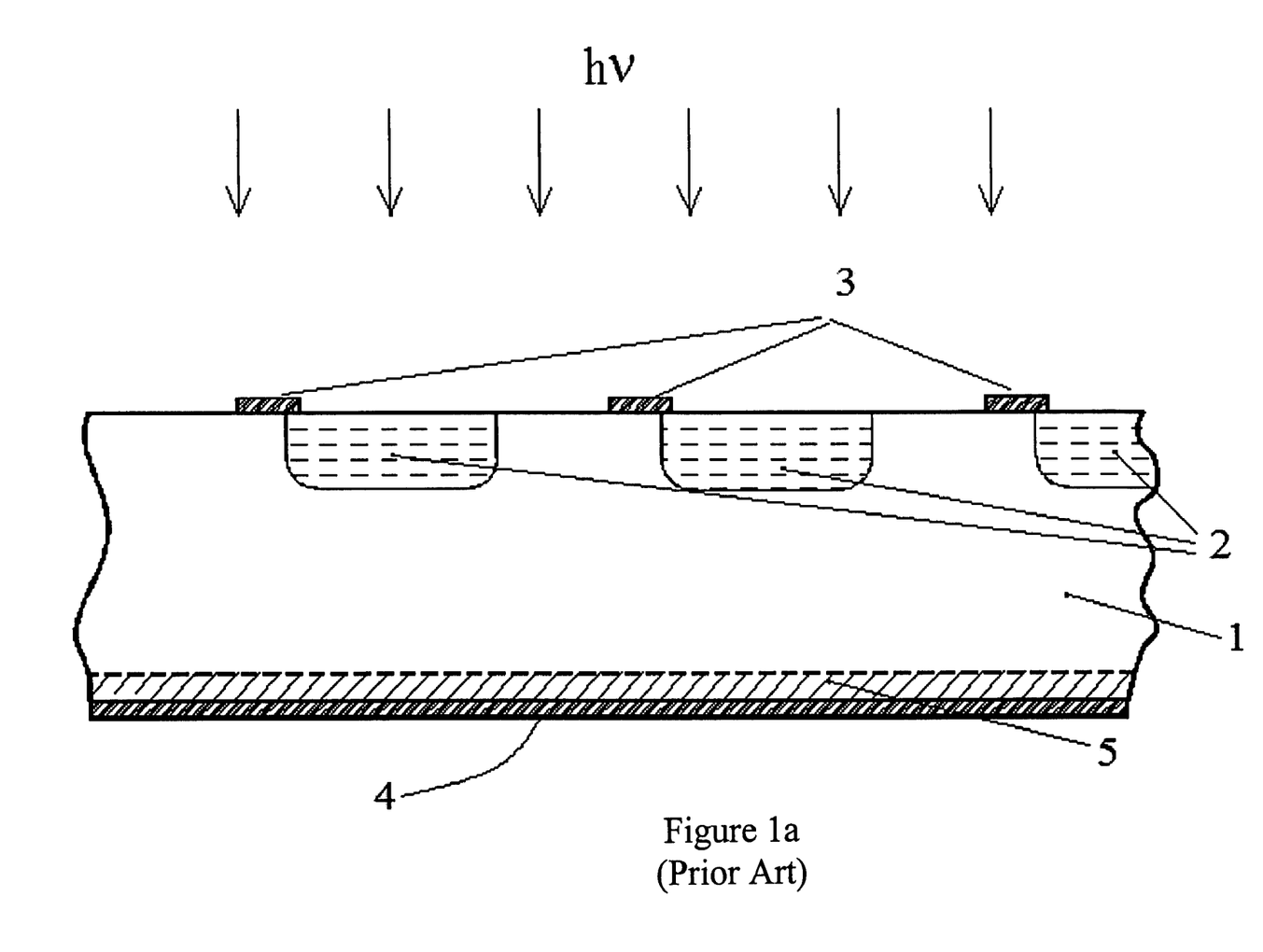
FIGS. 1a and 1b are schematic cross sections of typical, conventional prior art structures for the front illuminated photodiode arrays and back illuminated photodiode arrays, respectively.
Figure 1B:
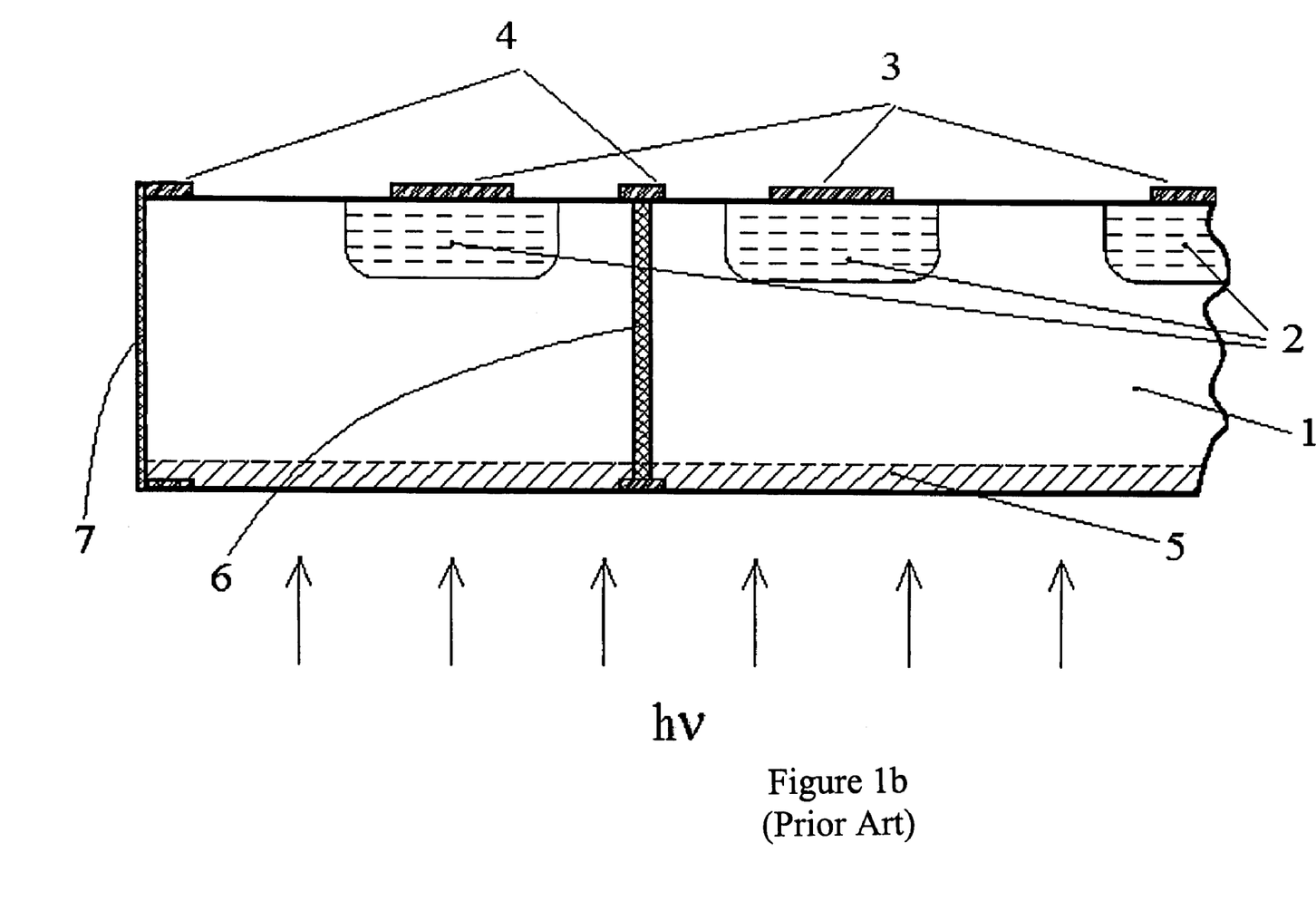

Conventional photodiode array structures are based on either front illuminated or back illuminated technologies. FIG. 1a is a simplified cross section of an exemplary prior art front illuminated photodiode array and FIG. 1b is a simplified cross section of an exemplary prior art back illuminated photodiode array. The substrate may be either n-type or p-type material, with opposite conductivity type diffused regions 2 therein. This creates a p-on-n or n-on-p structure, respectively. The anode metal pads 3 for the p-on-n structure (the cathode contacts for the n-on-p structure) are always on the device front surface. The opposite polarity electrode is usually coated (plated) on the chip backside in the case of the front illuminated structure (see metal layer 4, FIG. 1a), or is made on the device front surface (see metal pads 4, FIG. 1b) using metallized through vias 6,7 in the case of the back illuminated structure. (See also U.S. Published Patent Application Ser. Nos. 2003/0209652 A1, 2004/0104351 A1 and 2004/0129992 A1.) The blanket-type implantation 5 of the back surface of the die of the same conductivity type as the substrate improves both the charge collection efficiency and DC/AC electrical performance of the devices.

Each of the two approaches—the front illuminated and back illuminated structures—has its own advantages and disadvantages. For example, traditional front illuminated structures like that shown in FIG. 1a allow building high performance photodiodes and photodiode arrays, but impose severe constraints on the metal run width. Those constraints limit a design of the front illuminating photodiode array to the use of either a smaller number of elements, or larger gaps between adjacent elements. Note that the metal runs should be accommodated in between adjacent diffusion areas 2 (see FIG. 1a).

Back illuminated structures reported recently by several companies take advantage of solder bump technology to electrically connect elements of the array to an external substrate or PC board using the contacts (bumps) on the front surface of the structure. By utilizing solder bump technology, the metal interconnects, which usually reside on top of the active surface between the adjacent elements openings, may be moved to the substrate or PC board upon which the chip is mounted. Such an approach allows minimizing the gaps between adjacent elements of the array, at the same time allowing a virtually unlimited total number of elements. However, several drawbacks of the previously reported back illuminated structures limit their application:

1) First, these structures are usually fabricated using relatively thick wafers (>50 µm) and the resistivity of the material has to be high enough (>1000 Ohm-cm) to deplete the entire volume at zero bias, which is required for many applications;
2) Second, the application of a high resistivity material usually diminishes the photodiode performance with respect to the leakage current and shunt resistance;
3) Third, if a high resistivity material is not used, then the time response will be very long (micro seconds or even longer) because the time response would be determined by the diffusion processes rather than drift processes of the totally depleted structures;
4) Fourth, there are little or no structural features that isolate adjacent cells from each other within the entire thickness of the device, which results in relatively high cross-talk, especially at zero bias.

Summarizing, such parameters as the leakage current, shunt resistance, cross-talk, spectral sensitivity, and temporal response are of main concern for the prior art of back illuminated structures. Additionally, the handling of thin wafers (<70 µm thickness) in the wafer fabrication process is a matter of great concern by itself, and would become increasingly important with the further decrease of the wafer thickness.

BRIEF DESCRIPTION OF THE DRAWINGS

The main ideas of the invention are demonstrated by the accompanying drawings, in which.

DETAILED DESCRIPTION OF THE PREFERRED EMBODIMENTS

The objectives of the present invention include:
1) To provide multiple element, backside illuminated 2D-photodiode arrays with a superior performance of all elements;
2) To provide fabrication methods for the backside-illuminated photodiode array on an ultra thin wafer.

It is therefore an object of this invention to provide a structure for silicon multi-element, 2-D photodiode arrays having greatly improved characteristics over prior art arrays, making it useful in such applications as CT scanner applications, etc.

Another object is to provide a method of fabricating Si devices on ultra thin wafers, which method can be suitable for fabrication of flip-chip, multi-element, 2-dimensional arrays of silicon photodiodes.

Another object is to provide a method of handling ultra thin wafers during wafer fabrication, which method should secure ultra thin wafers against accidental breakage, etc.

These and other objects of the present invention will become apparent from the following disclosure. In this disclosure, first preferred embodiments of finished diode arrays will be described, and then the preferred method of fabricating the arrays will be described.

Figure 2:
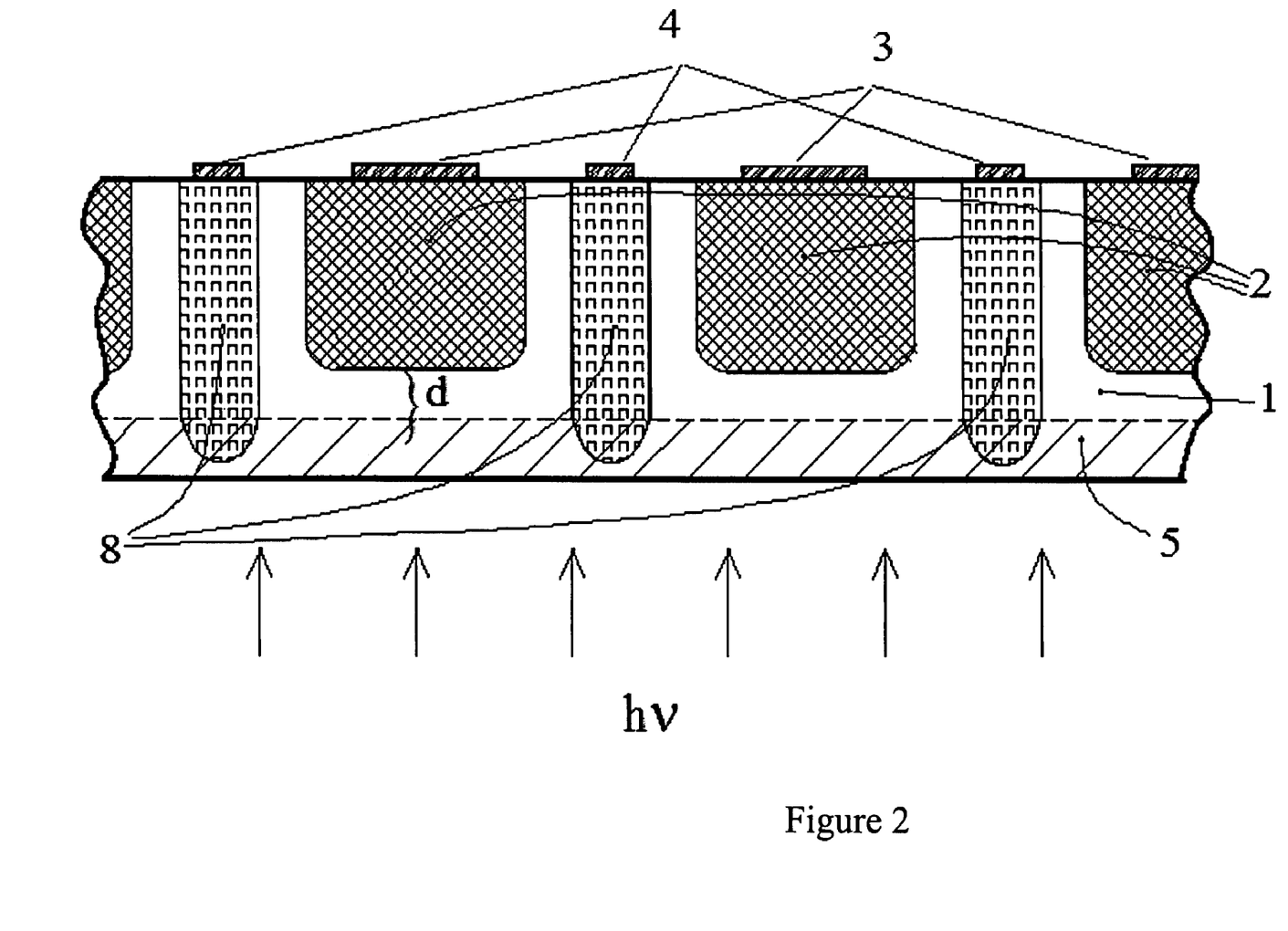
FIG. 2 is a schematic cross section of an ultra thin, back illuminating photodiode array in accordance with U.S. Pat. No. 6,762,473.

FIG. 2 is a simplified cross-sectional view of a semiconductor ultra-thin chip photodiode array in accordance with U.S. Pat. No. 6,762,473. The structure is built using either n-type or p-type bulk silicon 1. For brevity, the anode in the case of p-on-n structure or the cathode in the case of n-on-p structure will be referred to as "the first electrode", while the cathode in the case of p-on-n structure and the anode in the case of n-on-p structure will be referred to as "the second electrode".

The material resistivity, thickness of the wafer/die, dopants concentrations and doses, and diffusion conditions are preferably chosen to satisfy the following requirements:

a) The active area (the first electrode) diffusion 2 extends sufficiently close to the back surface of the finished die that the rest of the volume between the diffusion edge and the die back surface, the space indicated as "d" in the FIG. 2, becomes mostly or completely depleted at a zero volt bias;

b) The uniform, "blanket" type implantation 5 of the backside of the wafer with the implant of the same polarity as the one of the majority carriers of the wafer bulk 1 (first conductivity type) provides excellent majority carrier conductivity across the wafer backside;

c) In the method disclosed to fabricate the ultra thin, back illuminated photodiode array in accordance with U.S. Pat. No. 6,762,473, the second electrode, diffusion 8 (first conductivity type), is applied from the front surface of the wafer using the implantation and drive protocols that allow for the diffusion to reach the wafer backside, overlapping thereby with the blanket implantation 5 and providing good electrical contacts between the second electrode network across the entire wafer.

Figure 3:
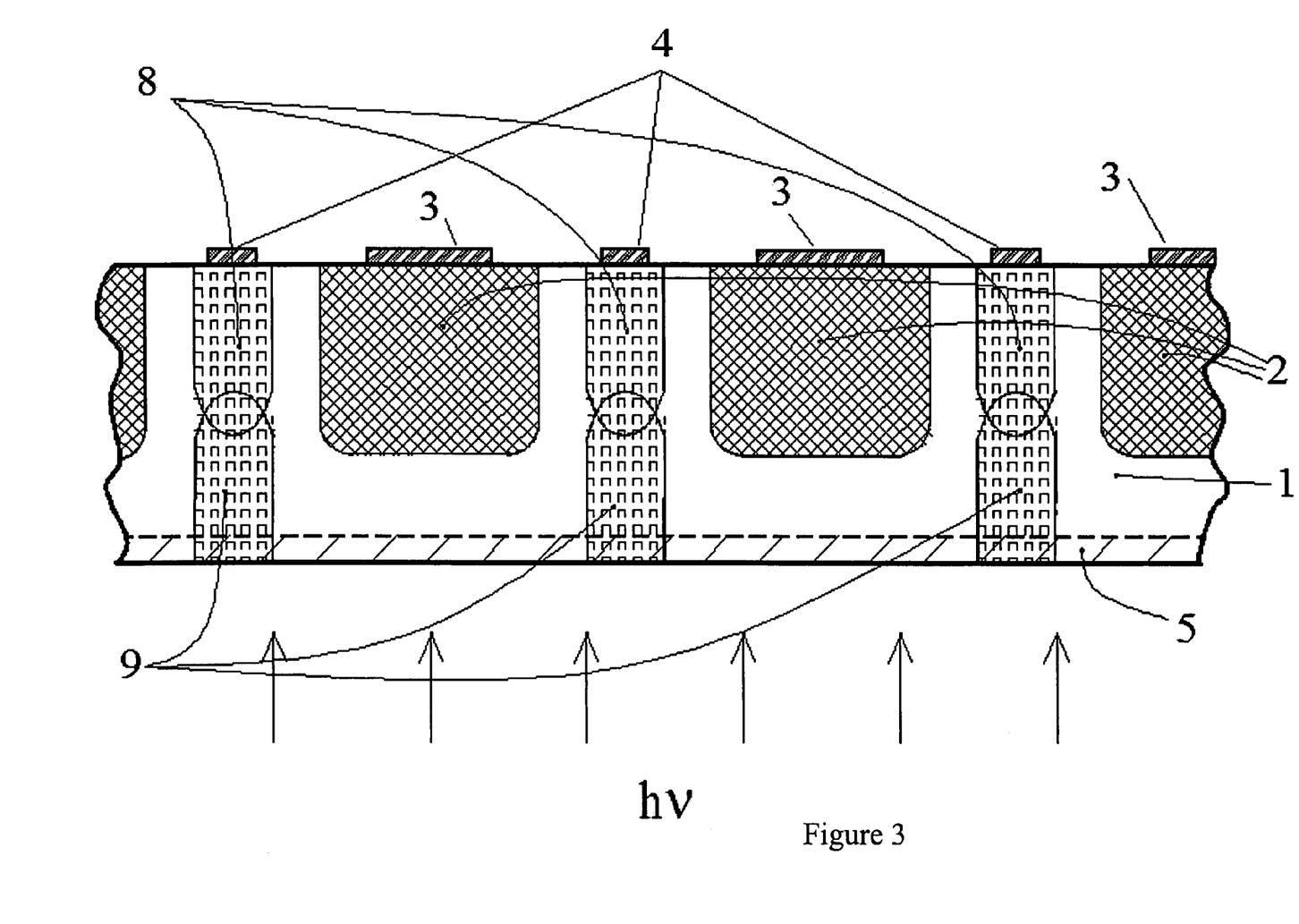
FIG. 3 is another example of a schematic cross section of an ultra thin, back illuminated photodiode array in accordance with U.S. Pat. No. 6,762,473 fabricated in accordance with the present invention method using diffusions 8 and 9 applied from both the front side and the backside of the substrate.

Another possibility is to use the structure of ultra thin, back illuminated photodiode array in accordance with U.S. Pat. No. 6,762,473, but fabricated using a method in which the second electrode is applied from both the front side and the backside of the wafer. This is illustrated in FIG. 3 as diffusions 8 and 9.

Figure 4A:
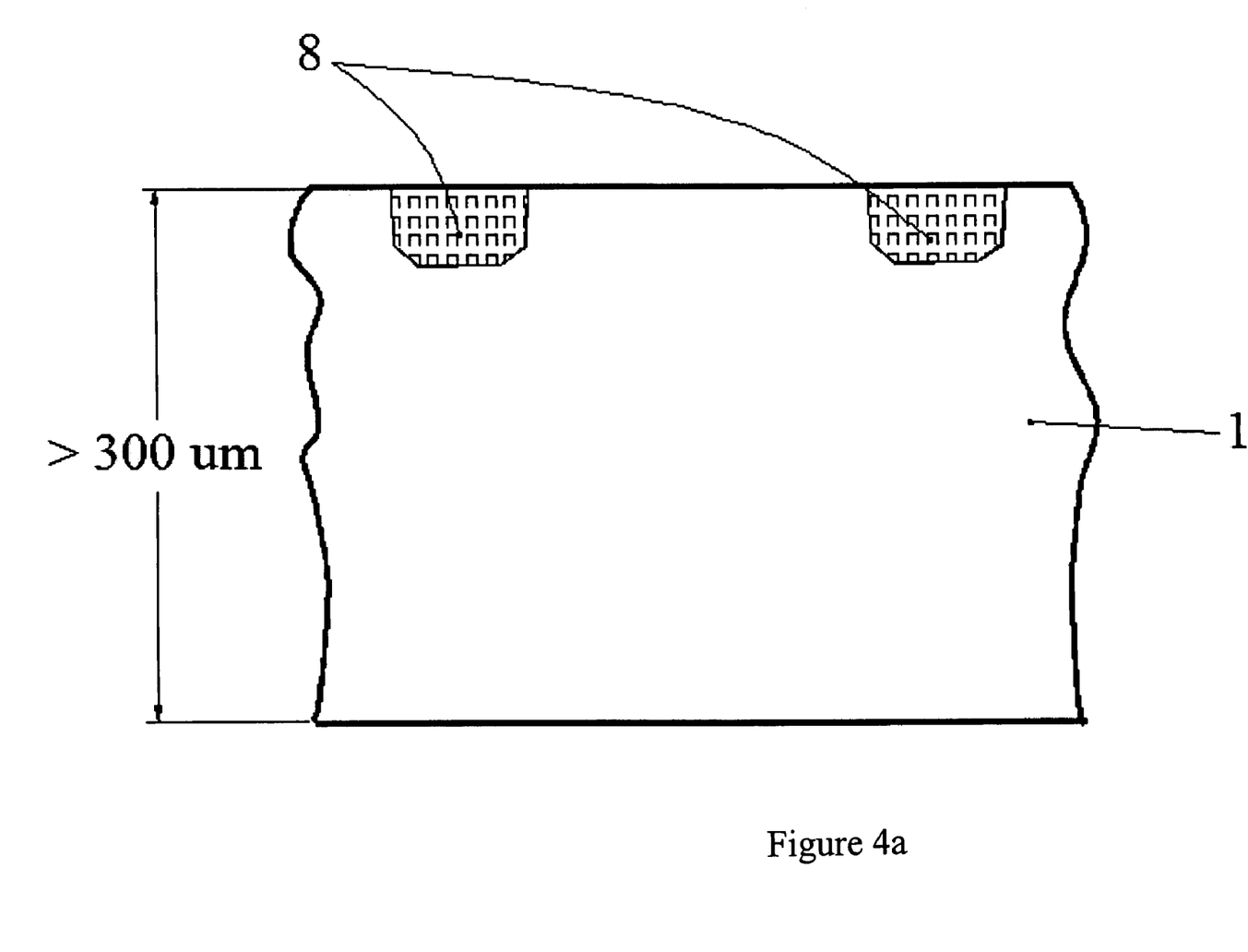
FIGS. 4a through 4e illustrate an exemplary sequence for a method for fabricating electrodes of a thin wafer photodiode array structure in accordance with the present invention.

Such a structure may be fabricated starting with a thicker substrate (for example 300 μm) for structural stiffness and integrity during the processing, using several masking steps. An exemplary processing method may be described as follows:

First, as shown in FIG. 4a, the second electrode 8 implantation/diffusion is applied, followed by a drive. This stage forms a small difference in diffusion depths as seen in FIG. 4b for the first electrodes 2 and second electrodes 8 as formed.

Figure 4B:
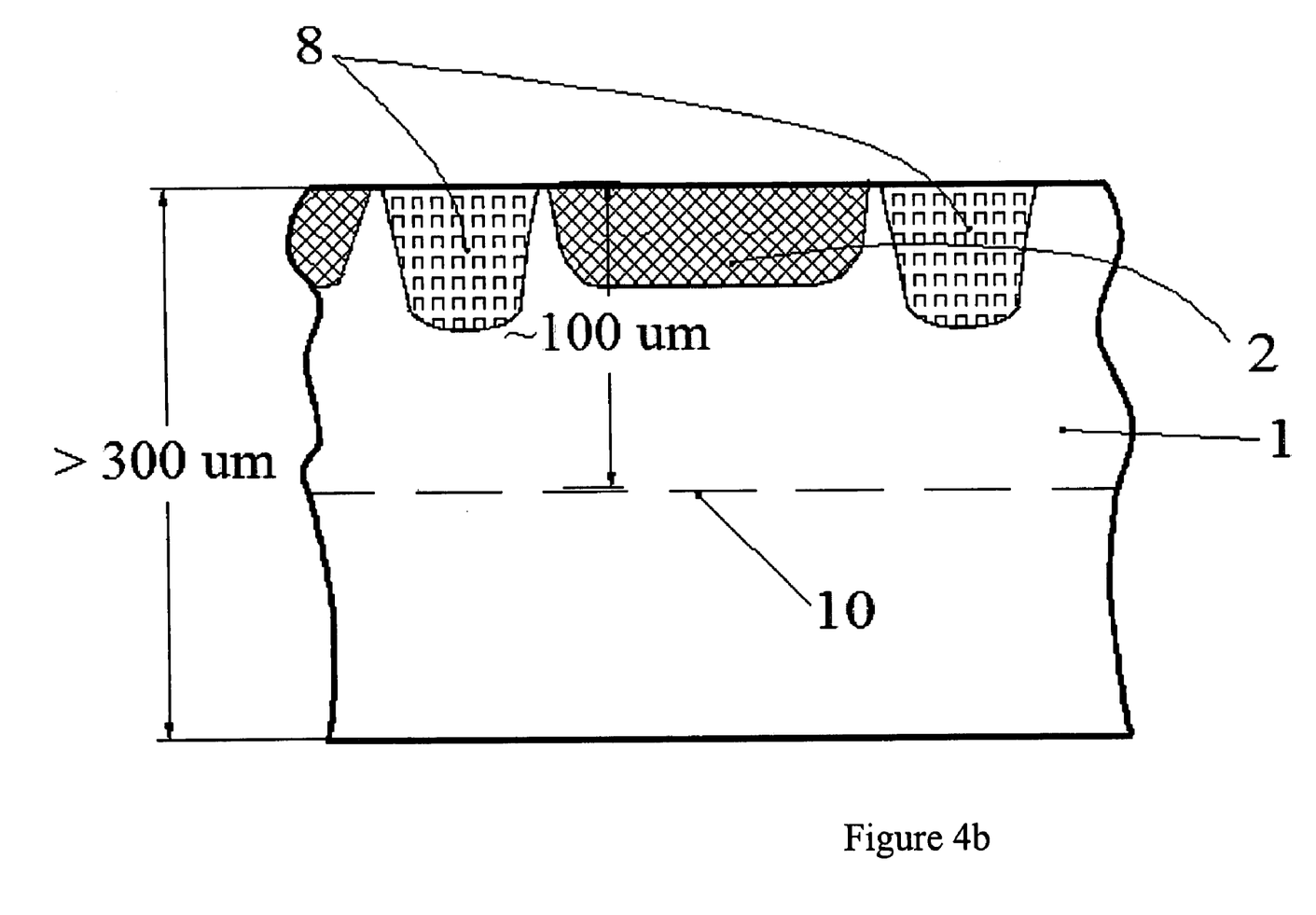

Second, as shown in FIG. 4b, the first electrode 2 implantation/diffusion is applied followed by a drive. The future back surface of the wafer after backside grinding and polishing is shown schematically with the dashed line 10.

The array is then reduced in thickness by grinding the backside of the array, preferably to provide a substrate thickness of under approximately 100 μm, and more preferably to approximately 50 or 30 μm. The final thickness achieved, of course, is preferably selected in accordance with the resistivity of the substrate and the depth of the first electrode 2 diffusion so that the diffusion 2 is spaced away from the backside of the substrate an amount that approximately equals the depletion depth for the substrate material at zero bias.

Figure 4C:
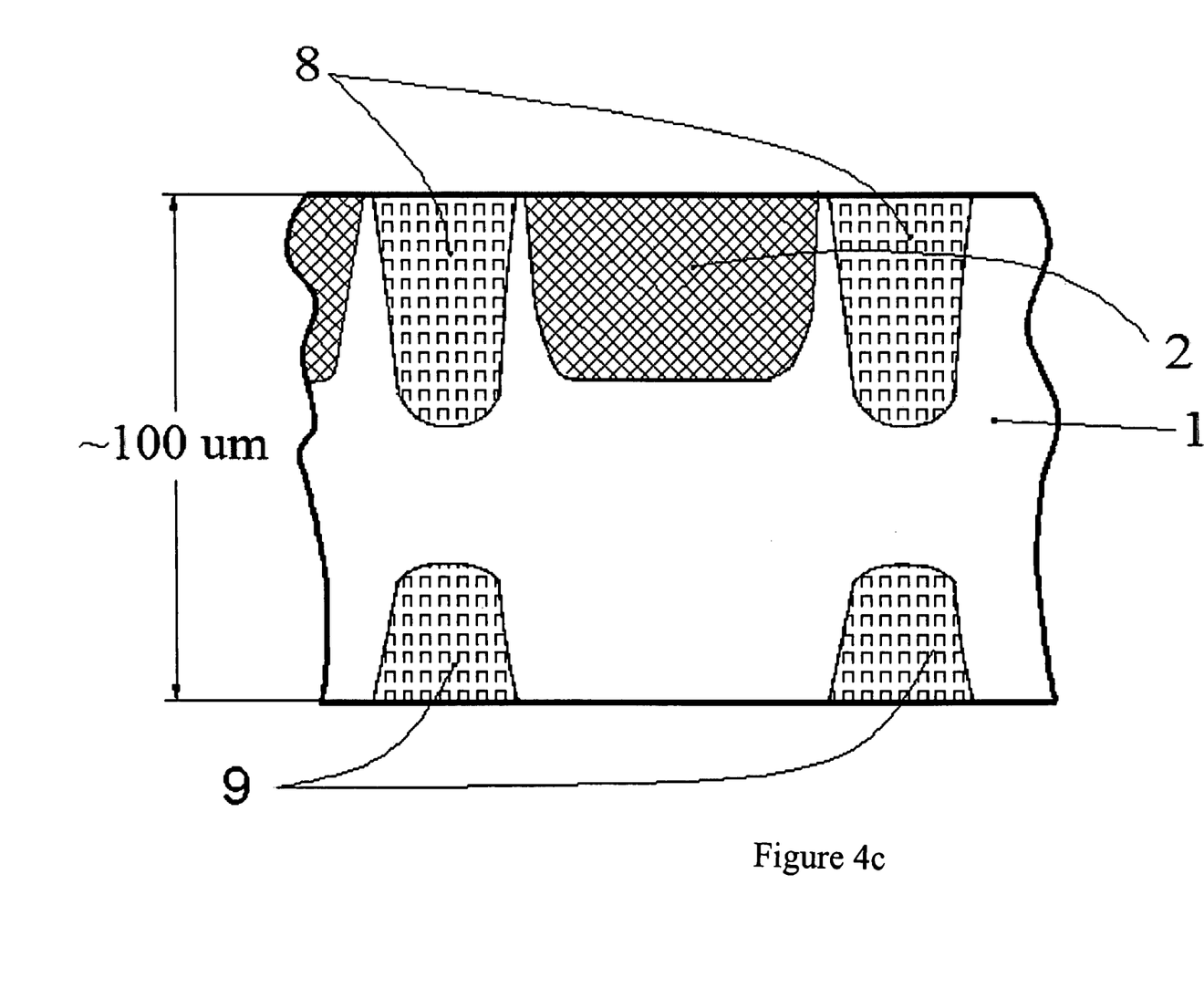

Third, the second electrode 9 is applied (implantation/diffusion) on the backside of the thin wafer, followed by a drive, as illustrated in FIG. 4c. At this point, there might (but not necessarily) be a small gap between the two electrodes of the same polarity, 8 and 9, as shown in FIG. 4c. In other words, the diffusion 8 might not necessarily contact the diffusion 9, and an additional drive might still be necessary to provide good electrical contact between the front and backside of the thin wafer through the diffusion regions 8 and 9. However, there may be an option when the two electrodes 9 and 8 contact each other without an additional drive, creating a good conducting path between the front surface and the backside of the wafer as illustrated in FIG. 4d.

Figure 4D:
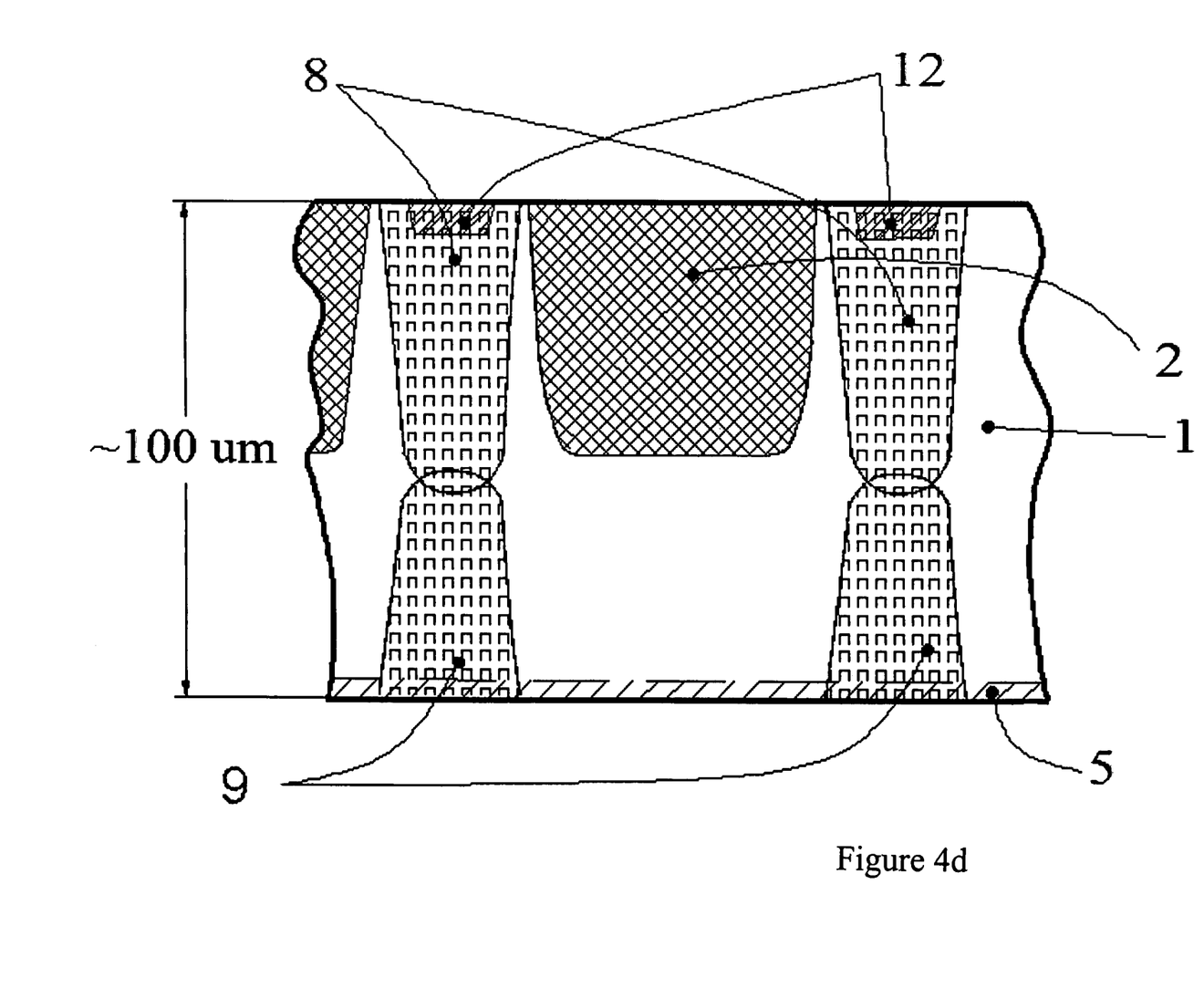

Fourth, as shown in FIG. 4d, the second electrode 8 receives an additional enhancement 12 followed by a drive to ensure superior electrical contacts and to activate dopants. By the end of this stage, the diffusion profiles of regions 2,8, and 9 almost reach their final configuration (see the solid lines and hatched areas in FIG. 4d). As an alternative, this additional enhancement may be done before reducing the thickness of the array. In that regard, the processing order set out in the appended claims is intended to be representative of one possible order, though is not to be considered a limitation of the claims.

Then a blanket implant of the first conductivity type is made to the backside of the wafer, which implant improves both the charge collection efficiency and DC/AC electrical performance of the photodiode arrays. Activation of the implant does not significantly alter the first and second electrode diffusions. Alternatively, a diffusion for the backside could be used if desired.

The photodiode arrays exhibit very low cross talk because of the excellent isolation of each pixel. Also, because of the small depletion volume, the arrays exhibit low noise and low temperature sensitivity. When used in X-ray systems, they exhibit low radiation damage, and have thermal characteristics similar to scintillators to which they will be mounted. The technique of using deep diffusions from both sides of a thin substrate for making electrical contact to the backside of the substrate may, of course be used in other semiconductor devices. Also while the deep diffusion in the preferred embodiment is of the same conductivity type as the substrate, this is not a limitation of the invention, as the deep diffusions may be of the opposite conductivity type, if desired.

Figure 4E:
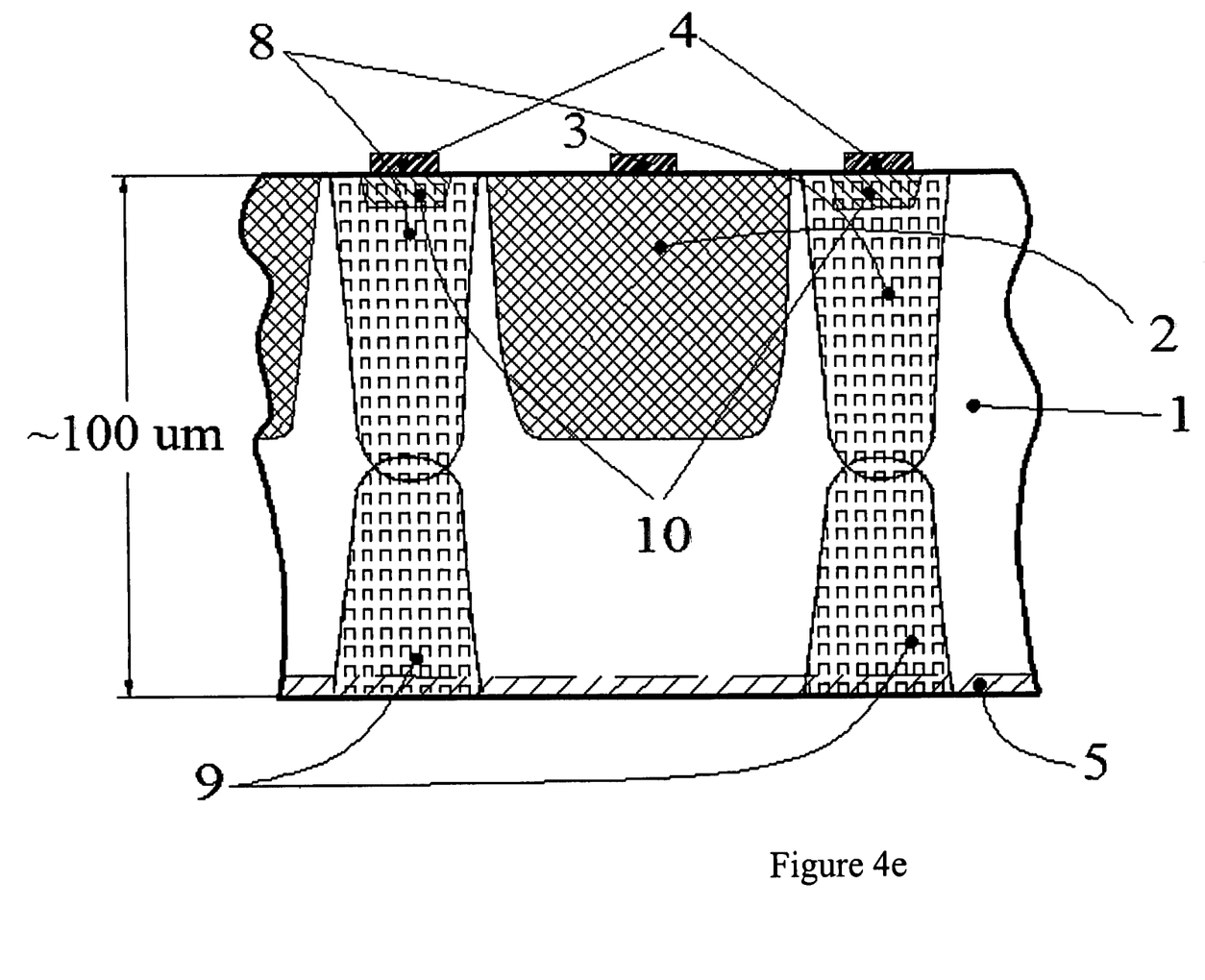

For many applications, the photodiode response time is a critical parameter. Using a p-type starting material can minimize the response time for the Si arrays. This is because the transit time for electrons as minority carriers is less than ⅓ of that for the holes. Hence, the structure shown in FIG. 4e can be built using p-type Si as a starting material to ensure fast response time.

With a p-type starting material, regions 8, 9 and 5 normally will be p-type regions of higher conductivity than the starting material, with regions 2 being n-type regions. However with an n-type starting material, regions 8, 9 and 5 normally will be n-type regions of higher conductivity than the starting material, with regions 2 being p-type regions. However for some applications, it may be desirable to reverse the conductivity type of the starting material, so that with an n-type starting material, regions 8, 9 and 5 will be p-type regions, with regions 2 being n-type regions of higher conductivity than the starting material, and with a p-type starting material, regions 8, 9 and 5 will be n-type regions, with regions 2 being p-type regions of higher conductivity than the starting material.

While preferred exemplary embodiments of the present invention have been disclosed herein, such disclosure is only for purposes of understanding the exemplary embodiments and not by way of limitation of the invention. It will be obvious to those skilled in the art that various changes in fabrication process and structure of the photodiode arrays may be made without departing from the spirit and scope of the invention, as set out in the full scope of the following claims.

What is claimed is:

1. A method of fabricating a photodiode array comprising:
providing a semiconductor substrate of a first conductivity type having first and second surfaces;
providing a first matrix of first regions of a first conductivity type of a higher conductivity than the substrate, including a high temperature diffusion, the first matrix of regions extending into the substrate from the first surface;
providing a plurality of second conductivity type interspersed within the first matrix of regions of the first conductivity type, including an additional high temperature diffusion, the second region extending into the substrate from the first surface a shorter distance than the first region;
grinding the substrate from the second surface to reduce the thickness of the substrate and to not expose the matrix of regions of a first conductivity type or the plurality of regions of the second conductivity type at the second surface of the substrate;
providing a second matrix of regions of a first conductivity type of a higher conductivity than the substrate extending into the substrate from the second surface, including a high temperature diffusion, the second matrix being aligned with the first matrix;
providing a layer of the first conductivity type having a conductivity greater than the substrate on the second surface of the substrate;
the first matrix of regions of a first conductivity type and the second matrix of regions of a first conductivity type contacting each other within the substrate; and,
providing at least one electrical contact to the first matrix of regions of the first conductivity type to form one electrode of the photodiode array, and providing an electrical contact to each second region of the second conductivity type to form a second electrode for each photodiode in the array.

2. The method of claim 1 wherein the layer of the first conductivity type having a conductivity greater than the substrate on the second surface of the substrate is provided by implantation.

3. The method of claim 1 wherein the substrate is ground to a thickness that separates the plurality of regions of the second conductivity type from the second surface of the substrate by an amount that approximately equals the depletion depth for the substrate at zero bias.

4. The method of claim 3 wherein the substrate provided is an n-type silicon substrate having a resistivity of approximately 400 ohm-cm.

5. The method of claim 3 wherein the substrate provided is a p-type silicon substrate.

6. The method of claim 1 wherein the plurality of contacts are a plurality of ball grid contacts.

7. The method of claim 6 wherein the plurality of contacts are of substantially equal size evenly distributed across the photodiode array.

8. A method of fabricating a photodiode array comprising:
providing a semiconductor substrate having first and second surfaces;
providing a first matrix of regions of a first conductivity type of a higher conductivity than the substrate, including a high temperature diffusion, the first matrix of regions extending into the substrate from the first surface;
providing a plurality of regions of the second conductivity type interspersed within the first matrix of regions of the first conductivity type, including an additional high temperature diffusion, the second region extending into the substrate from the first surface a shorter distance than the first region;
grinding the substrate from the second surface to reduce the thickness of the substrate and to not expose the matrix of regions of a first conductivity type or the plurality of regions of the second conductivity type at the second surface of the substrate;
providing a second matrix of regions of a first conductivity type of a higher conductivity than the substrate extending into the substrate from the second surface, including a high temperature diffusion, a second matrix being aligned with the first matrix;
providing a layer of the first conductivity type having a conductivity greater than the substrate on the second surface of the substrate;
the first matrix of regions of a first conductivity type and the second matrix of regions of a first conductivity contacting each other within the substrate; and,
providing a plurality of electrical contacts at the first surface for the first region in the form of a matrix of regions of a first conductivity type and the plurality of regions of the second conductivity type;
wherein the plurality of regions of the second conductivity type are separated from the second surface of the substrate by approximately 9 μm.

9. A method of fabricating a photodiode array compromising:
providing a semiconductor substrate having first and second surfaces;
providing a first matrix of regions of a first conductivity type of a higher conductivity than the substrate, including a high temperature diffusion the first matrix of regions extending into the substrate from the first surfacer;
providing a plurality of regions of the second conductivity type interspersed within the first matrix of regions of the first conductivity type including an additional high temperature diffusion the second region extending into the substrate from the fast surface a shorter distance than the first region;
grinding the substrate from the second surface to reduce the thickness of the substrate and to not expose the matrix of regions of a first conductivity type or the plurality of reatons of the second conductivity type at the second surface of the substrate;
providing a second matrix of regions of a first conductivity type of a higher conductivity than the substrate extending into the substrate from the second surface including a high temperature diffusion, the second matrix being alianed with the first matrix;
providing a layer of the first conductivity type having a conductivity greater than the substrate on the second surface of the substrate;
the first matrix of regions of a first conductivity type and the second matrix of regions of a first conductivity type contacting each other within the substrate; and
providing a plurality of electrical contacts at the first surface for the first region in the form of a matrix of regions of a first conductivity type and the plurality of regions of the second conductivity type:
wherein the substrate is ground to a thickness of less than approximately 50 μm.

10. A method of fabricating a photodiode array comprising:
provrding semiconductor substrate having first and second surfaces;
providing a first matrix of regions of a first conductivity type of a higher conductivity than the substrate, including a high temperature diffusion, the first matrix of regions extending into the substrate from the first surface;
providing a plurality of regions of the second conductivity type interspersed within the first matrix of regions of the first conductivity type, including an additional high temperature diffusion, the second region extending into the substrate from the first surface a shorter distance than the first region;
grinding the substrate from the second surface to reduce the thickness of the substrate and to not expose the matrix of regions of a first conductivity type or the plurality of regions of the second conductivity type at the second surface of the substrate;
providing a second matrix of regions of a first conductivity type of a higher conductivity than the substrate extending into the substrate from the second surface, including a high temperature diffusion, the second matrix being aligned with the first matrix;
providing a layer of the first conductivity type having a conductivity greater than the substrate on the second surface of the substrate;
the first matrix of reeions of a first conductivity type and the second matrix of regions of a fast conductivity type contacting each other within the substrate; and
providing a plurality of electrical contacts at the first surface for the first region in the form of a matrix of regions of a first conductivity type and the plurality of regions of the second conductivity type;
wherein the substrate is ground to a thickness of approximately 30 µm.

11. A method of fabricating a photodiode array comprising:
providing a silicon substrate of a first conductivity type having first and second surfaces;
providing a matrix of regions of a first conductivity type of a higher conductivity than the substrate, including a high temperature diffusion, the first region extending into the substrate from the first surface;
providing a plurality of regions of the second conductivity type interspersed within the matrix of regions of the first conductivity type, including an additional high temperature diffusion, the second region extending into the substrate from the first surface a shorter distance than the first region;
providing additional doping of the first region, including a farther high temperature diffusion;
grinding the substrate from the second surface to reduce the thickness of the substrate to less than approximately 50 µm and to not expose the matrix of regions of a first conductivity type and the plurality of regions of the second conductivity type at the second surface of the substrate;
providing a second matrix of regions of a first conductivity type of a higher conductivity than the substrate extending into the substrate from the second surface, including a high temperature diffusion, the second matrix being aligned with the first matrix;
providing a layer of the first conductivity type having a conductivity greater than the substrate on the second surface of the substrate;
the first matrix of regions of a first conductivity type and the second matrix of regions of a first conductivity type contacting each other within the substrate; and,
providing a plurality of electrical contacts at the first surface for the first region in the form of a matrix of regions of a first conductivity type and the plurality of regions of the second conductivity type.

12. The method of claim 11 wherein providing a silicon substrate comprises providing a silicon substrate of a first conductivity type.

13. The method of claim 11 wherein providing a silicon substrate comprises providing a silicon substrate of a second conductivity type.

14. The method of claim 11 wherein the layer of the first conductivity type having a conductivity greater than the substrate on the second surface of the substrate is provided by implantation.

15. The method of claim 11 wherein the substrate is ground to a thickness that separates the plurality of regions of the second conductivity type from the second surface of the substrate by an amount that approximately equals the depletion depth for the substrate at zero bias.

16. The method of claim 15 wherein the substrate provided is an n-type silicon substrate having a resistivity of approximately 400 ohm-cm.

17. The method of claim 15 wherein the substrate provided is an p-type silicon substrate.

18. The method of claim 11 wherein the plurality of regions of the second conductivity type are separated from the second surface of the substrate by approximately 9 µm.

19. The method of claim 11 wherein the plurality of contacts are a plurality of ball grid contacts.

20. The method of claim 19 wherein the plurality of contacts are of substantially equal size evenly distributed across the photodiode ray.

21. The method of claim 11 wherein the substrate is ground to a thickness of approximately 30 µm.

* * * * *